(12) United States Patent
Suzuki et al.

(10) Patent No.: US 6,566,031 B1
(45) Date of Patent: *May 20, 2003

(54) POSITIVE PHOTORESIST COMPOSITION, SUBSTRATE WITH A PHOTOSENSITIVE FILM AND PROCESS FOR IMAGING A RESIST PATTERN

(75) Inventors: Takako Suzuki, Kanagawa (JP); Kousuke Doi, Kanagawa (JP); Hidekatsu Kohara, Kanagawa (JP); Toshimasa Nakayama, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/669,589

(22) Filed: Sep. 26, 2000

(30) Foreign Application Priority Data

Sep. 27, 1999 (JP) .......................................... 11-273351

(51) Int. Cl.[7] ........................ G03F 7/021; C07C 245/12
(52) U.S. Cl. ...................... 430/191; 430/192; 430/193; 430/326; 534/556
(58) Field of Search .................................. 430/191, 192, 430/326, 193; 534/556

(56) References Cited

U.S. PATENT DOCUMENTS

| | | | |
|---|---|---|---|
| 5,407,779 A | | 4/1995 | Uetani et al. ................ 430/192 |
| 5,576,138 A | * | 11/1996 | Ando et al. .................. 430/191 |
| 5,726,217 A | | 3/1998 | Ichikawa et al. .............. 522/59 |
| 5,866,724 A | | 2/1999 | Ichikawa et al. ........... 568/720 |
| 6,068,962 A | | 5/2000 | Uetani et al. ................ 430/192 |
| 6,177,226 B1 | * | 1/2001 | Kurihara et al. ............ 430/191 |
| 6,379,859 B2 | * | 4/2002 | Suzuki et al. ............... 430/191 |

* cited by examiner

Primary Examiner—John S. Chu
(74) Attorney, Agent, or Firm—Sughrue Mion, PLLC

(57) ABSTRACT

A positive photoresist composition includes (A) an alkali-soluble resin, (B) a photosensitizer including, for example, a quinonediazide ester of bis[2,5-dimethyl-3-(2-hydroxy-5-methylbenzyl)-4-hydroxyphenyl]methane, and (C) a compound having a gram absorption coefficient of 5 to 60 with respect to light with a wavelength of 365 nm.

11 Claims, 5 Drawing Sheets

FIG. 2

| | 355ms | 370ms | 385ms | 400ms | 415ms | 430ms | 445ms | 460ms | 475ms | 490ms | 505ms | 520ms | 535ms |
|---|---|---|---|---|---|---|---|---|---|---|---|---|---|
| -1.0 | | | | | | | | | | | | | |
| -0.8 | | | | | | | | | | | | | |
| -0.6 | | | | | | 0.435 | 0.402 | 0.389 | | | | 0.313 | |
| -0.4 | | | | 0.499 | 0.461 | | | 0.387 | | | 0.339 | 0.318 | |
| -0.2 | | | 0.495 | | | | 0.388 | 0.379 | 0.366 | 0.351 | | | 0.311 |
| 0 | 0.503 | 0.485 | | | | | 0.385 | 0.372 | | | | | 0.315 |
| 0.2 | 0.498 | 0.473 | 0.452 | 0.440 | 0.423 | 0.405 | 0.385 | | 0.360 | 0.348 | 0.339 | 0.329 | 0.318 |
| 0.4 | | | 0.455 | 0.438 | | | | | | | | | 0.317 |
| 0.6 | | | | | 0.420 | 0.407 | 0.391 | 0.375 | 0.361 | 0.353 | 0.336 | 0.320 | 0.313 |
| 0.8 | | | | | | | | | | | | | |
| 1.0 | | | | | | | | | | | | | |
| 1.2 | | | | | | | | | | | | | |

FIG. 3

| | 340ms | 355ms | 370ms | 385ms | 400ms | 415ms | 430ms | 445ms | 460ms | 475ms | 490ms | 505ms | 520ms |
|---|---|---|---|---|---|---|---|---|---|---|---|---|---|
| -1.0 | | | | | | | | | | | | | |
| -0.8 | | | | | | | | | | | | | |
| -0.6 | | | | | | | | | | | | | |
| -0.4 | | | | | | | 0.433 | | | | | 0.315 | |
| -0.2 | | | | | 0.455 | 0.415 | | 0.401 | 0.389 | 0.375 | 0.350 | 0.313 | |
| 0 | | | | 0.485 | | | | | 0.385 | | | 0.311 | |
| 0.2 | | | 0.499 | 0.469 | 0.455 | 0.428 | 0.405 | 0.389 | 0.374 | | | 0.310 | |
| 0.4 | | | | | | | | | 0.373 | 0.348 | 0.325 | 0.311 | |
| 0.6 | | | | | | | 0.410 | 0.390 | 0.379 | 0.352 | 0.321 | 0.309 | |
| 0.8 | | | | | | | | | | | | | |
| 1.0 | | | | | | | | | | | | | |
| 1.2 | | | | | | | | | | | | | |

FIG. 4

| | 280ms | 295ms | 310ms | 325ms | 340ms | 355ms | 370ms | 385ms | 400ms | 415ms | 430ms | 445ms | 460ms |
|---|---|---|---|---|---|---|---|---|---|---|---|---|---|
| -1.0 | | | | | | | | | | | | | |
| -0.8 | | | | | | | | | | | | | |
| -0.6 | | | | | | | | | | | | | |
| -0.4 | | | | | | | 0.415 | 0.399 | 0.389 | 0.375 | 0.323 | | |
| -0.2 | | | | | 0.498 | 0.430 | | | 0.383 | | | 0.318 | |
| 0 | | | | 0.483 | 0.451 | 0.429 | 0.404 | 0.389 | 0.373 | 0.351 | 0.329 | | 0.304 |
| 0.2 | | | | | 0.460 | 0.435 | 0.401 | | 0.380 | | | 0.315 | 0.305 |
| 0.4 | | | | | | | | 0.403 | 0.388 | | | | 0.301 |
| 0.6 | | | | | | | | | | 0.356 | 0.331 | 0.315 | 0.299 |
| 0.8 | | | | | | | | | | | | 0.313 | |
| 1.0 | | | | | | | | | | | | | |
| 1.2 | | | | | | | | | | | | | |

POSITIVE PHOTORESIST COMPOSITION, SUBSTRATE WITH A PHOTOSENSITIVE FILM AND PROCESS FOR IMAGING A RESIST PATTERN

BACKGROUND OF THE INVENTION

1. Field of the Invention

The present invention relates to a positive photoresist composition which exhibits a high sensitivity and a high definition and has improved focal depth range properties and underexposure margin.

The present invention also relates to a positive photoresist composition which can satisfactorily image a pattern in a process using a 0.2- to 0.8-μm thin film.

2. Description of the Related Art

In production of very large scale integrated circuits (VLSIS) where a high definition of not more than half a micron, particularly of not more than 0.35 μm is required, demands have been made to provide photoresist compositions which exhibit satisfactory sensitivity, definition, underexposure margin, and focal depth range properties and can image resist patterns with good shapes.

The term "underexposure margin" as used herein is the ratio Eop/Es, where Eop is the exposure to reproduce a pattern in exact accordance with predetermined dimensions of a mask pattern, and Es is the minimum exposure to image an isolated pattern. The higher the underexposure margin is, the higher the margin, and is preferred.

Japanese Patent Laid-Open No. 6-167805 (conventional technology 1) discloses a high-definition positive photoresist composition including, as a photosensitizer, a quinonediazide ester having a linear tetranuclear to heptanuclear polyphenol skeleton. This photosensitizer exhibits a high definition but has a very low underexposure margin for its very high y value. The photosensitizer therefore tends to fail to image patterns in areas where exposure is low (underexposure side).

In the exposure step, therefore, underexposure occurs and the imaging of a resist pattern is blocked when the exposure time period is only several milliseconds less than the optimum exposure (exposure Eop) or when the thickness of a resist film becomes only several hundred nanometers thicker at locations corresponding to steps of a substrate. Thus, satisfactory resist patterns cannot be imaged.

In addition, a material containing the photosensitizer in question cannot image a pattern when the focus of a light source shifts to the plus side (i.e., the light focus is present on the substrate side from the surface of the resist) upon exposure in the imaging of a resist pattern with a fine line-and-space (L&S) of not more than 0.35 μm (FIG. 1(a)). This is a peculiar characteristic of this type of photosensitizer as compared with a material containing a photosensitizer including no linear tetranuclear to heptanuclear skeleton, such as a quinonediazide ester of a compound shown by the following formula (i) (FIG. 1(b)).

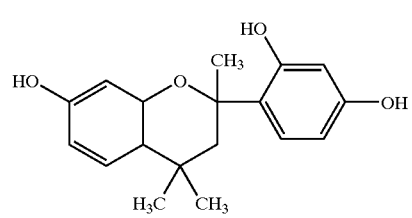
(i)

As a result, the photosensitizer is disadvantageous in that it is narrow in focal depth range and cannot image a resist pattern of the predetermined dimensions when the distance between a light source and a substrate shifts in the exposure step or when a resist film is formed on a stepped substrate and hence the surface of resist film is uneven due to steps of the substrate.

Japanese Patent Laid-Open No. 10-213906 (conventional technology 2) discloses a positive photoresist composition including a compound shown by the following formula (ii):

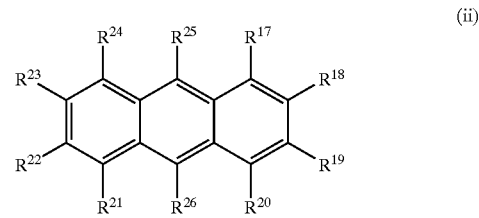
(ii)

wherein each of $R^{17}$ to $R^{24}$ is independently a hydrogen, a halogen, a hydroxyl group, an alkyl group, an alkoxy group, an aryl group, or a nitro group; each of $R^{25}$ and $R^{26}$ is independently a hydrogen, a halogen, an alkyl group, an aryl group, a nitro group, $-(CH_2)_n-OR^{27}$, or $-(CH_2)_n-COOR^{28}$, where $R^{27}$ is a hydrogen, an alkyl group, an aryl group, or an alkanoyl group, $R^{28}$ is a hydrogen, an alkyl group, or an aryl group, and n is an integer of 0 to 3, and a quinonediazide ester of a phenol compound shown by the following formula (i):

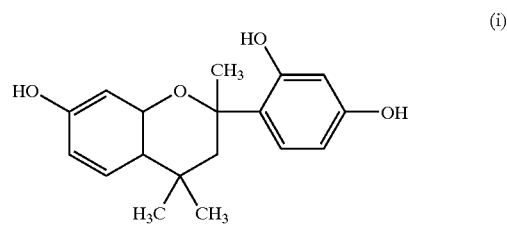
(i)

The publication states that this composition can inhibit reduction in film thickness of a resist and exhibits satisfactory definition and focal depth range properties.

The positive photoresist composition, however, exhibits narrow or low underexposure margin and focal depth range properties in the imaging of a resist pattern with a fine L&S of not more than 0.35 μm.

Separately, a photolithography technique using an i-ray (365 nm) cannot significantly image an ultrafine resist pattern of not more than 0.35 μm, particularly of not more than 0.30 μm. Accordingly, the uses of a light source (e.g., KrF and ArF) having a shorter wavelength than the i-ray and of an expensive chemically amplified photoresist material have been proposed.

However, an exposure system for excimer laser such as KrF or ArF is a very expensive system, and the chemically amplified resist material used with this type of system is also expensive, which invites increased production costs.

Accordingly, demands have been made to prolong the use of the conventional photolithography technique using i-ray. When an ultrafine resist pattern of not more than 0.35 μm, and particularly of not more than 0.30 μm is to be formed using i-ray, a photosensitive film should be advantageously a thin film. However, a thin film of the photosensitive film of not more than 1.0 μm, particularly of not more than 0.8 μm cannot sufficiently absorb light energy upon exposure, and cannot inhibit the interference of light waves. A fine resist pattern cannot therefore be imaged. Even if a resist pattern is imaged, the film thickness in unexposed areas is reduced or a residue (scum) after development is formed at the bottom of a resist pattern, inviting defective etching of the underlayer substrate.

SUMMARY OF THE INVENTION

Accordingly, it is an object of the present invention to provide a positive photoresist composition which exhibits a high sensitivity and a high definition and has improved focal depth range properties and underexposure margin in the production of very large scale integrated circuits (VLSIs) where a high definition of not more than 0.35 μm is required.

Another object of the present invention is to provide a positive photoresist composition which can image an ultrafine resist pattern of not more than 0.30 μm in a process using a 0.2- to 0.8-μm thin film.

After intensive investigations to achieve the above objects, the present inventors found that an invented positive photoresist composition mentioned below can image a resist pattern having satisfactory focal depth range properties and underexposure margin even in the imaging of an ultrafine resist pattern with a fine L&S of not more than 0.35 μm.

They also found that the invented positive photoresist composition can image a satisfactory resist pattern even in the imaging of an ultrafine resist pattern of not more than 0.30 μm in a process using a 0.2- to 0.8-μm thin film. The invention has been accomplished based on these findings.

Specifically, the present invention provides, in an aspect, a positive photoresist composition. The composition includes (A) an alkali-soluble resin, (B) a photosensitizer including a quinonediazide ester of at least one selected from compounds shown by the following formula (I):

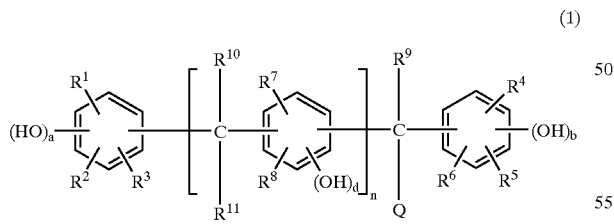

wherein each of $R^1$ to $R^8$ is independently a hydrogen atom, a halogen atom, an alkyl group having 1 to 6 carbon atoms, an alkoxy group having 1 to 6 carbon atoms, or a cycloalkyl group; each of $R^9$, $R^{10}$, and $R^{11}$ is independently a hydrogen atom or an alkyl group having 1 to 6 carbon atoms; Q is a hydrogen atom, an alkyl group having 1 to 6 carbon atoms, or is combined with $R^9$ to form a carbocycle having 3 to 6 carbon atoms, or is a residue shown by the following formula (II); each of a and b is an integer of 1 to 3; d is an integer of 0 to 3, and n is an integer of 0 to 3:

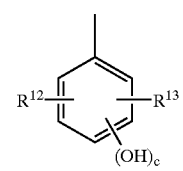

wherein each of $R^{12}$ and $R^{13}$ is independently a hydrogen atom, a halogen atom, an alkyl group having 1 to 6 carbon atoms, an alkoxy group having 1 to 6 carbon atoms, or a cycloalkyl group; and c is an integer of 1 to 3; and (C) a compound having a gram absorption coefficient of 5 to 60 with respect to light with a wavelength of 365 nm.

In the positive photoresist composition, the ingredient (A) is preferably an alkali-soluble novolak resin obtained synthetically by a condensation reaction of a phenol compound ingredient with an aldehyde or a ketone, and the phenol compound ingredient includes 1 to 20% by mole of a phenol compound shown by the following formula (III):

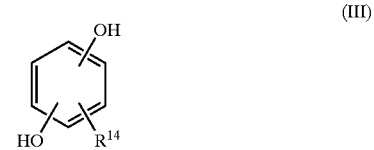

wherein $R^{14}$ is a hydrogen atom or an alkyl group having 1 to 5 carbon atoms, 30 to 95% by mole of m-cresol, and 2 to 50% by mole of 2,5-xylenol.

The phenol compound ingredient for use in the synthesis of the ingredient (A) may further include 1 to 30% by mole of at least one phenol compound selected from p-cresol, 3,4-xylenol, 3,5-xylenol, and dimethylol derivatives of these compounds.

In the positive photoresist composition, the phenol compound ingredient for use in the synthesis of the ingredient (A) may include, instead of 2,5-xylenol, 1 to 25% by mole of a phenol compound shown by the following formula (IV):

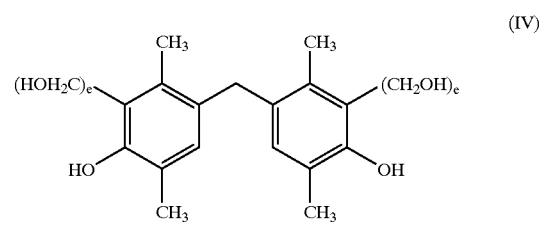

wherein e is 0 or 1.

The ingredient (C) in the positive photoresist composition may be 2,2',4,4'-tetrahydroxybenzophenone having a gram absorption coefficient of 47.4.

The ingredient (C) may be a compound shown by the following formula (V) having a gram absorption coefficient of 29.3.

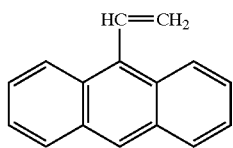

(V)

The ingredient (C) may also be a compound shown by the following formula (VI) having a gram absorption coefficient of 27.4.

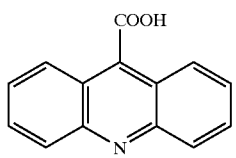

(VI)

Alternatively, the ingredient (C) may be a compound shown by the following formula (VII) having a gram absorption coefficient of 18.8.

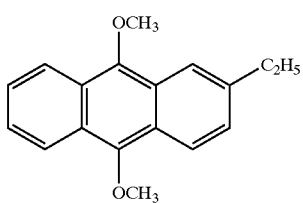

(VII)

The invention provides, in another aspect, a substrate with a photosensitive film. The substrate with a photosensitive film is obtained by applying a film of the aforementioned positive photoresist composition onto a substrate, and drying the applied film to form a photosensitive film having a thickness of 0.2 to 0.8 μm on the substrate.

In a further aspect, the invention provides a process for imaging a resist pattern. This process includes the step of subjecting the aforementioned substrate with a photosensitive film to a selective exposure with i-ray (365 nm) to image a resist pattern.

BRIEF DESCRIPTION OF THE DRAWINGS

FIG. 2 is a diagram showing a process window when a composition according to Example 1 is used;

FIG. 3 is a diagram showing a process window when a composition according to Comparative Example 1 is used;

FIG. 4 is a diagram showing a process window when a composition according to Comparative Example 2 is used;

DETAILED DESCRIPTION OF THE INVENTION

Description of Ingredients

[(A) Alkali-soluble Resin]

Figure 1:
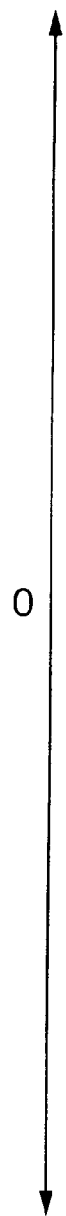
FIG. 1 is a diagram showing the relationship between a focal point of a light source upon exposure and a resist pattern imaging.
Figure 1:
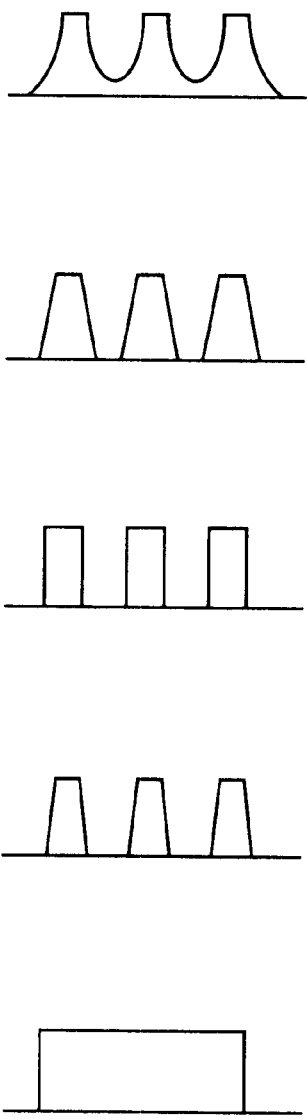
Figure 1:
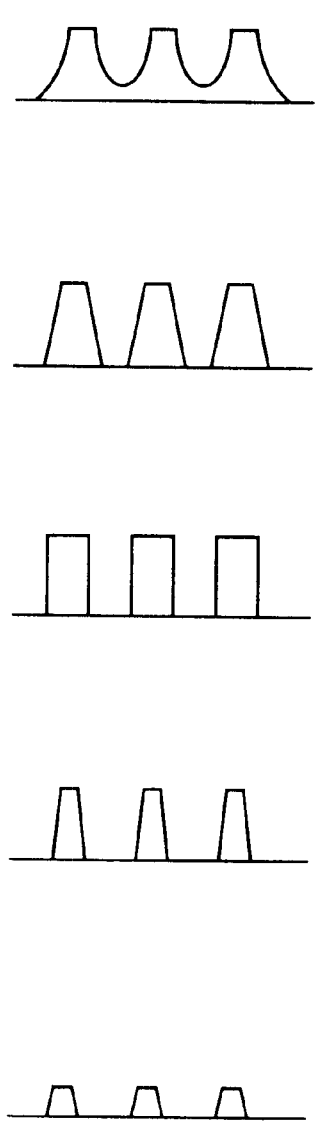

Alkali-soluble resins for use as the ingredient (A) are not particularly limited. Preferred alkali-soluble resins are alkali soluble novolak resins obtained synthetically by using, based on the total phenol compounds for use in the synthesis of the alkali-soluble resins, 1 to 20% by mole, and especially 3 to 15% by mole of the phenol compound of the formula (III); 30 to 95% by mole, and especially 50 to 70% by mole of m-cresol, and 2 to 50% by mole, and especially 10 to 40% by mole of 2,5-xylenol. When the compound of the formula (IV) is used instead of 2,5-xylenol, the proportion of the compound of the formula (IV) is 1 to 25% by mole, and especially 5 to 20% by mole in the total phenol compound ingredient. The use of these alkali-soluble novolak resins can minimize the reduction in film thickness in unexposed areas, can avoid the formation of scum, and can image resist patterns with good shapes in a process using a thin film of not more than 1.0 μm, and particularly of 0.2 to 0.8 μm.

The proportions of the phenol ingredients in the preferred alkali-soluble novolak resins are specified for the following reasons. If the proportion of the phenol compound of the formula (III) is less than 1% by mole, a sufficiently high sensitivity cannot be significantly obtained, and if it exceeds 20% by mole, the definition and other characteristics are markedly deteriorated. If the proportion of m-cresol is less than 30% by mole, the sensitivity is markedly deteriorated, and if it exceeds 95% by mole, definition and other characteristics are markedly deteriorated. If the proportion of 2,5-xylenol is less than 2% by mole or the proportion of the phenol compound of the formula (IV) is less than 1% by mole, scum is formed in large amounts, and if the proportion of 2,5-xylenol exceeds 50% by mole or the proportion of the phenol compound of the formula (IV) exceeds 25% by mole, sensitivity and other characteristics are markedly deteriorated.

The phenol compounds of the formula (III) include, but are not limited to, catechol, resorcinol, hydroquinone, 3-methylcatechol, 4-methylcatechol, 2-methylresorcinol, 4-methylresorcinol, 5-methylresorcinol, and 2-methylhydroquinone. Among them, typically preferred are resorcinol compounds shown by the following formula (VIII):

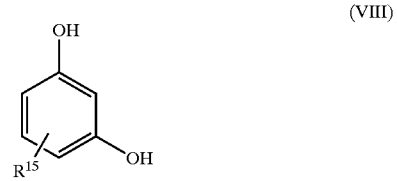

(VIII)

wherein $R^{15}$ is an alkyl group having 1 to 5 carbon atoms, and hydroquinone compounds shown by the following formula (IX):

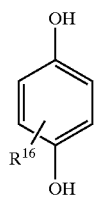

(IX)

wherein $R^{16}$ is an alkyl group having 1 to 5 carbon atoms. Specifically, hydroquinone, 2-methylresorcinol, 5-methylresorcinol, and 2-methylhydroquinone are desirable for their satisfactory characteristics such as sensitivity, definition, and heat resistance, of which hydroquinone is typically preferred for its high definition.

The phenol compound ingredient for use in the synthesis of the alkali-soluble resin ingredient (A) in the invention should preferably further comprise at least one selected from p-cresol, 3,4-xylenol, 3,5-xylenol, and dimethylol derivatives thereof in a proportion of 1 to 30% by mole, and especially 5 to 20% by mole based on the total mole of the phenol compound ingredient. The resulting positive photoresist composition will have an improved definition.

If the proportion of the above additional component is less than 1% by mole, the definition may not be sufficiently improved, and if it exceeds 30% by mole, the sensitivity may be markedly deteriorated.

Other phenol compounds in addition to the above phenol components can be used for the synthesis of the alkali-soluble resin in the invention. Such phenol compounds include, but are not limited to, phenol; o-cresol, 2,3-xylenol, and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkyl-substituted phenols; p-methoxyphenol, m-methoxyphenol, p-ethoxyphenol, m-ethoxyphenol, p-propoxyphenol, m-propoxyphenol, and other alkoxy-substituted phenols; o-isopropenylphenol, p-isopropenylphenol, 2-methyl-4-isopropenylphenol, 2-ethyl-4-isopropenylphenol, and other isopropenyl-substituted phenols; phenylphenol, and other aryl-substituted phenols; 4,4'-dihydroxybiphenyl, bisphenol A, pyrogallol, and other polyhydroxyphenols. Each of these compounds can be used alone or in combination.

In order to avoid the deterioration of the characteristics of the positive photoresist composition, the proportion of these additional phenol compounds should be preferably not more than 10% by mole based on the total phenol compound ingredient used in the synthesis of the alkali-soluble resin for use in the invention.

The alkali-soluble resin for use in the invention can be prepared by any process (e.g., bulk polymerization or solution polymerization), and timings of the addition of individual phenol compounds and a reaction path and other reaction conditions can be freely selected. Preferably, the production process can synthetically produce a resin with less unreacted materials, where the individual phenol compounds are incorporated as components into the resulting resin in accordance with the charged proportions.

In an example of such preferred processes, a low-reactivity phenol compound such as p-cresol is initially converted into a dimethylol derivative, and the dimethylol derivative is added to large amounts of the other phenol compounds over a long time period. By this technique, the low-reactivity phenol compound can be integrated into a polymer skeleton. Alternatively, an oligomer having a constitutional repeating unit of such a low-reactivity phenol compound is initially prepared, and the oligomer is subjected to a condensation reaction with a high-reactivity phenol compound such as m-cresol using an aldehyde or a ketone.

A thin film of the-alkali-soluble resin for use in the invention should be dissolved in a 2.38% by weight tetramethylammonium hydroxide (TMAH) aqueous solution at 23° C. in a rate of preferably 1 to 50 nm/sec., and especially 2 to 10 nm/sec.

If the dissolution rate is less than 1 nm/sec., the sensitivity may be markedly deteriorated, and if it exceeds 50 nm/sec., the definition and other characteristics may be markedly deteriorated.

The alkali-soluble resin has a weight average molecular weight of preferably 2000 to 20000, and particularly preferably 3000 to 15000. An alkali-soluble resin having a weight average molecular weight of less than 2000 exhibits markedly deteriorated film-forming property, heat resistance and other characteristics. An alkali-soluble resin having a weight average molecular weight exceeding 20000 may exhibit a markedly deteriorated sensitivity. The alkali-soluble resin for use in the invention should preferably comprise no low molecular weight fraction. The removal of low molecular weight fractions is advantageously conducted by, for example, the following manner. The novolak resin solution is dissolved in methyl amyl ketone (MAK), and the resulting solution is washed with water to remove a catalyst and unreacted materials. To the residual is added a poor solvent such as hexane or heptane, or a hexane-MAK or heptane-MAK mixture, and the resulting mixture is stirred and is then allowed to stand to separate a poor solvent layer containing lower molecular weight fractions as an upper layer, and a MAK layer containing high molecular weight fractions as a lower layer. The lower layer is extracted to yield a resin having a higher molecular weight.

[(B) Photosensitizer]

The use of a quinonediazide ester of at least one selected from the compounds of the formula (I) can provide a positive photoresist composition having a high definition. Of such quinonediazide esters, preferred are quinonediazide esters of a linear polyphenol compound shown by the following formula (I-a):

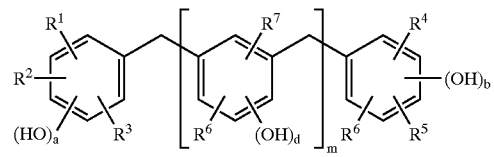

(I-a)

wherein $R^1$ to $R^8$, a, b, and d have the same meanings as defined above; and m is an integer of 1 to 3, or of a trisphenol type polyphenol compound of the following formula (I-b):

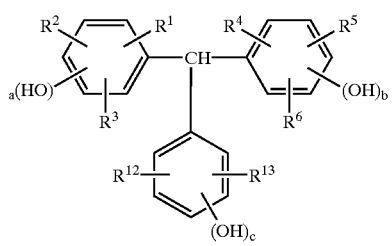

(I-b)

wherein $R^1$ to $R^6$, $R^{12}$, $R^{13}$, a, b, and c have the same meanings as defined above. The resulting resist compositions using these quinonediazide esters can exhibit a high definition and can image fine patterns of not more than 0.35 µm. The esters can be prepared through an esterification reaction of the compound of the formula (I) with a 1,2-naphthoquinonediazidesulfonyl halide.

The quinonediazide ester of the compound of the formula (I) has an average esterification degree of 20 to 80%, and preferably 40 to 60%. If the average esterification degree is less than 20%, a film residual rate and definition are deteriorated, and if it exceeds 80%, the sensitivity is markedly deteriorated and the scum is increased.

The photosensitizer ingredient (B) may further comprise other quinonediazide esters, in addition to the quinonediazide ester of the compound of the formula (I). Such additional quinonediazide esters include, but are not limited to, quinonediazide esters of 2,3,4-trihydroxybenzophenone, 2,4,4'-trihydroxybenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2'3,4,5'-pentahydroxybenzophenone, 2,3',4,5,5'-pentahydroxybenzophenone, 2,3,3',4,4',5'-hexahydroxybenzophenone, and other polyhydroxybenzophenones; and quinonediazide esters of phenol, p-methoxyphenol, dimethylphenol, hydroquinone, naphthol, pyrocatechol, pyrogallol monomethyl ether, pyrogallol-1,3-dimethyl ether, gallic acid, partially esterified or partially etherized gallic acid, and other phenols.

When the additional quinonediazide ester is used, the proportion of the ester is not more than 50% by weight, and preferably not more than 40% by weight based on the total weight of the ingredient (B). If the proportion exceeds 50% by weight, the definition may be markedly deteriorated.

In the invented positive photoresist composition, the proportion of the ingredient (B) is preferably 10 to 60% by weight, and more preferably 20 to 50% by weight relative to the total weight of the alkali-soluble resin ingredient (A) and the sensitizer (D) added according to necessity. If the proportion of the ingredient (B) is less than the above range, an image in exact accordance with a pattern cannot be obtained. In contrast, if the proportion of the ingredient (B) exceeds the above range, the sensitivity and a uniformity of the formed resist film are deteriorated, and the definition is decreased.

[Ingredient (C)]

According to the present invention, a compound having a gram absorption coefficient of 5 to 60, and preferably 20 to 50 with respect to light with a wavelength of 365 nm is added to the positive photoresist composition. This configuration is advantageous to improve the pattern imaging property when the focus of a light source is shifted to the plus side upon exposure, and the underexposure margin.

By adding the ingredient (C), the resulting photosensitive film formed from the invented photoresist composition on a substrate can sufficiently absorb light energy upon exposure to thereby image an ultrafine resist pattern of not more than 0.30 µm, in a process using a thin film of not more than 1.0 µm, and especially of 0.2 to 0.8 µm.

If the gram absorption coefficient is less than 5, the pattern imaging property when the focus of a light source is shifted to the plus side upon exposure and the underexposure margin may not be sufficiently improved. In contrast, if it exceeds 60, the sensitivity may be markedly deteriorated, and the pattern imaging property when the focus of a light source may be shifted to the plus side upon exposure is decreased.

The term "gram absorption coefficient" as used herein may be simply referred to as "absorptivity", and is defined by the following equation. Gram absorption coefficient (as)=(As)/(b.c), wherein As is an absorbance, b (cm) is a thickness of a sample (thickness inside a cell), and c (g/l) is a concentration of the sample (ENCYCLOPAEDIA CHIMICA 1, p. 950, published on Feb. 5, 1971 by Kyoritsu Shuppan Co., Ltd., Japan). A quartz cell 1 cm thick inside the cell is preferably used as the cell. The absorbance can be determined by, for example, a process described in Manual for Instrumental Analysis (1) (p. 97–115, published on Apr. 1, 1989 by Kagaku Dojin Publishing Co., Ltd., Japan)

Such compounds include, for example, 2,2',4,4'-tetrahydroxybenzophenone having a gram absorption coefficient of 47.4, a compound of the formula (V) having a gram absorption coefficient of 29.3:

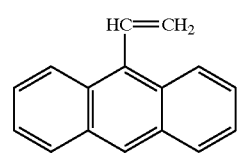

(V)

a compound of the formula (VI) having a gram absorption coefficient of 27.4:

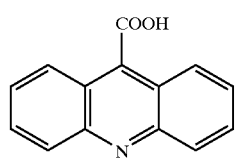

(VI)

and a compound of the formula (VII) having a gram absorption coefficient of 18.8:

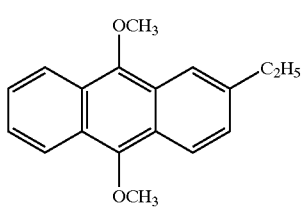

(VII)

The proportion of the ingredient (C) relative to the total weight of the ingredients (A) and (B) and the sensitizer (D) added according to necessity is preferably about 0.1 to 5.0% by weight, and more preferably about 0.5 to 3.0% by weight when the resulting photosensitive film has a thickness exceeding 1.0 µm. The proportion of the ingredient (C) is preferably about 0.5 to 15% by weight, and more preferably about 5 to 10% by weight when the resulting photosensitive film has a thickness not more than 1.0 µm, and particularly of 0.2 to 0.8 µm.

If the proportion of the ingredient (C) is less than the above ranges, the definition tends to be deteriorated, and the pattern imaging property when the focus of a light source is shifted to the plus side upon exposure and the underexposure margin are not sufficiently improved. If the proportion exceeds the above ranges, the sensitivity tends to be deteriorated, and the pattern imaging property when the focus of a light source is shifted to the plus side upon exposure is not sufficiently improved.

[(D) Sensitizer (Intensifier)]

Sensitizers (intensifiers) for use as the ingredient (D) are not limited, and any known sensitizers can be used.

For example, the compounds of the formula (I) can be used as the ingredient (D). Such ingredients (D) include, but are not limited to, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, and 1,1-bis(4-hydroxyphenyl)cyclohexane. In addition, 6-hydroxy-4a-(2,4-dihydroxyphenyl)-9-1'-spirocyclohexyl-1,2,3,4,4a,9a-hexahydroxanthene, and 6-hydroxy-5-methyl-4a-(2,4-dihydroxy-3-methylphenyl)-9-1'-spirocyclohexyl-1,2,3,4,4a,9a-hexahydroxanthene can be used as the ingredient (D).

Of these compounds, typically preferred are, for example, 1,1-bis(4-hydroxyphenyl)cyclohexane, bis(4-hydroxy-3,5-dimethylphenyl)-3,4-dihydroxyphenylmethane, and 2,6-bis(3,5-dimethyl-4-hydroxybenzyl)-4-methylphenol.

When these ingredients (D) are incorporated into the positive photoresist composition, the proportion of the ingredients (D) is 5 to 50% by weight, and preferably 10 to 35% by weight relative to the weight of the alkali soluble resin ingredient (A).

To improve definition, exposure margin and film residual rate, the invented positive photoresist composition may further comprise p-toluenesulfonyl chloride (PTSC), 4,4'-bis(diethylamino)benzophenone, 1,4-bis[1-(2-methyl-4-hydroxy-5-cyclohexylphenyl)isopropyl]benzene, and/or 1,3-bis[1-(2-methyl-4-hydroxy-5-cyclohexylphenyl)isopropyl]benzene, each in a proportion of about 0.01% to 10% by weight relative to the total weight of the composition.

In addition to the above specified ingredients, where necessary, the invented positive photoresist composition may further comprise any of compatible additives including, for example, ultraviolet absorbents for inhibition of halation and surfactants for prevention of striation within ranges not adversely affecting the objects of the invention. Examples of the ultraviolet absorbents include 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4,4-diethylaminoazobenzeneandcurcumin. The surfactants include, but are not limited to, Fluorade FC-430 and FC-431 (trade names, manufactured by Sumitomo 3M Ltd., Japan), F-TOP EF122A, EF122B, EF122C and EF126 (trade names, Tochem Products Ltd., Japan) and other fluorine-containing surfactants.

The invented positive photoresist composition may be preferably used as a solution obtained by dissolving each of the above-specified ingredients (A) to (D) and various additives in an appropriate solvent. Such solvents include those conventionally used in positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers and other polyhydric alcohols and derivatives thereof; dioxane, and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents may be used alone or in combination. Of these solvents, typically preferred are acetone, methyl ethyl ketone, cyclohexanone, methyl isoamyl ketone, 2-heptanone, and other ketones; and ethyl lactate, methyl acetate, ethyl acetate, butyl acetate, methyl pyruvate, ethyl pyruvate, methyl methoxypropionate, ethyl ethoxypropionate, and other esters.

Preferably, the invented composition is used, for example, in the following manner. Each of the ingredients (A), (B), (C), or (D) and other ingredients added according to necessity is dissolved in an appropriate solvent as mentioned above to yield a coating solution; the coating solution is then applied, using a spinner or the like, onto a substrate such as a silicon wafer or a substrate on which an antireflection coating has been formed, and is then dried to form a photosensitive layer; next, the photosensitive layer is irradiated and is exposed with an ultraviolet ray source such as a low-pressure mercury lamp, a high-pressure mercury lamp, an ultra-high-pressure mercury lamp, an arc lamp, or a xenon lamp, through a desired mask pattern, or is irradiated with a scanning electron beam; and the exposed portions of the film are then dissolved and are removed by dipping the substrate in a developer solution, for example, an alkaline aqueous solution such as a 1% to 10% by weight tetramethylammonium hydroxide (TMAH) aqueous solution, thus forming an image in exact accordance with the mask pattern.

EXAMPLES

The present invention is further illustrated by the following invented examples and comparative examples.

Initially, using the invented positive photoresist compositions, a series of photosensitive films having a thickness exceeding 1.0 µm were prepared and were subjected to the following tests. Each of the characteristics of the positive photoresist compositions was evaluated according to the following manner, respectively.

(1) Sensitivity

A sample was applied onto a silicon wafer using a spinner, and was dried on a hot plate at 90° C. for 90 sec. to form a resist film having a thickness of 1.05 µm. The resist film was then irradiated through a mask (reticle) corresponding to a 0.35-μm resist pattern with a line-and-space (L&S) of 1:1 for an increasing period from 0.1 sec. at intervals of 0.01 sec. using a reducing-type projection aligner NSR-2005i10D (manufactured by Nikon Corporation, Japan; NA=0.57). The film was then post-exposure baked (PEB) at 110° C. for 90 sec.; was subjected to developing in a 2.38% by weight tetramethylammonium hydroxide aqueous solution at 23° C. for 60 sec., was washed with water for 30 sec., and was dried. In this procedure, the sensitivity was defined as the optimum exposure time period (Eop) (ms) to reproduce a 0.35-μm resist pattern with a L&S width of 1:1.

(2) Underexposure Margin

A sample was applied onto a silicon wafer using a spinner, and dried on a hot plate at 90° C. for 90 sec. to form a resist film having a thickness of 1.05 μm. The resist film was then irradiated through a mask (reticle) corresponding to a 0.35-μm resist pattern with a L&S of 1:1 for an increasing period from 0.1 sec. at intervals of 0.01 sec., using a reducing-type projection aligner NSR-2005i10D (manufactured by Nikon Corporation, Japan; NA=0.57). The film was then post-exposure baked (PEB) at 110° C. for 90 sec.; was subjected to developing in a 2.38% by weight tetramethylammonium hydroxide (TMAH) aqueous solution at 23° C. for 60 sec. washed with water for 30 sec., and was dried. In this procedure, the underexposure margin was defined as Eop/Es, where the minimum exposure time period to reproduce an isolated pattern after development was defined as Es (ms) and Eop was defined as above.

(3-1) Plus-side Focal Depth Range Properties

The plus-side focal depth range property was defined as the critical deviation (em) to reproduce a 0.35-μm resist pattern with a L&S of 1:1 within a variation of ±10% of the predetermined dimensions when the focus was shifted to the plus side (to the substrate side) at the optimum exposure Eop.

(3-2) Total Focal Depth Range Properties

The total focal depth range property was defined as the critical deviation (sm) to reproduce a 0.35-μm resist pattern with a L&S of 1:1 within a variation of ±10% of the set dimensions of the pattern when the focus was shifted up and down as appropriate.

(4) Definition

The definition was defined as the critical definition at an exposure which reproduced a 0.35-μm mask pattern.

Example 1

Ingredient (A): a resin ingredient: an alkali-soluble novolak resin [a novolak resin composed of m-cresol:p-cresol:2,5-xylenol=5:1:4 (by mole) and having a weight average molecular weight of 6800, whose low-molecular weight fractions were removed]

Ingredient (B): a sensitizer: b1/b2=7/1 (by weight) [b1: an ester of 1 mole of bis[2,5-dimethyl-3-(2-hydroxy-5-methylbenzyl)-4-hydroxyphenyl]methane and 2 moles of 1,2-naphthoquinonediazide-5-sulfonyl chloride (hereinafter referred to as "5-NQD"), b2: an ester of 1 mole of methyl gallate and 3 moles of 5-NQD]

Ingredient (C): a compound of the following formula (V) having a gram absorption coefficient of 29.3

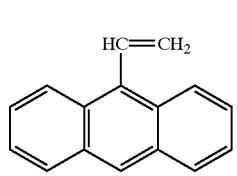

(V)

Ingredient (D): a sensitizer (intensifier): d1/d2=1/1 (by weight), wherein d1 is a phenol compound of the following formula (d1):

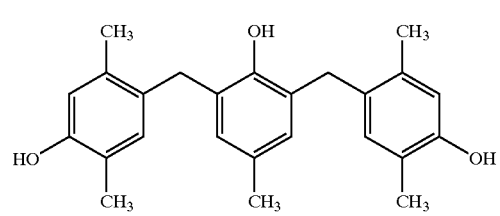

(d1)

and d2 is a phenol compound of the following formula (d2):

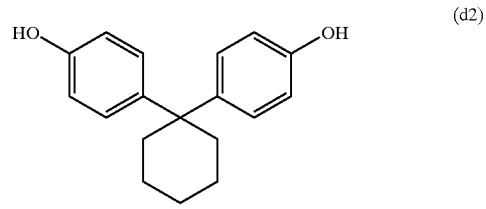

(d2)

In 470 parts by weight of 2-heptanone, 100 parts by weight of the ingredient (A), 57 parts by weight of the ingredient (B), 1.9 parts by weight (1.0% by weight relative to the total of the ingredients (A), (B) and (D)) of the ingredient (C), and 33 parts by weight of the ingredient (D) were dissolved, and the resulting solution was filtrated through a 0.2-μm membrane filter to yield a positive photoresist composition.

Example 2

A positive photoresist composition was prepared in the same manner as in Example 1, except that the ingredient (C) was changed to a compound of the following formula (VI) having a gram absorption coefficient of 27.4.

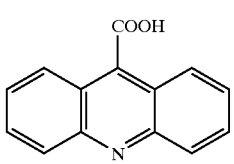

(VI)

Example 3

A positive photoresist composition was prepared in the same manner as in Example 1, except that the ingredient (C) was changed to a compound of the following formula (VII) having a gram absorption coefficient of 18.8.

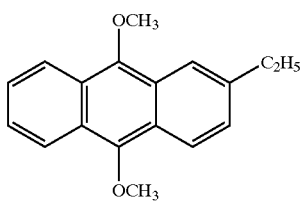

(VII)

Example 4

A positive photoresist composition was prepared in the same manner as in Example 1, except that the ingredient (C) was changed to 2,2',4,4'-tetrahydroxybenzophenone.

Example 5

A positive photoresist composition was prepared in the same manner as in Example 1, except that the amount of the ingredient (C) was changed to 0.95 part by weight (0.5% by weight relative to the total weight of the ingredients (A), (B), and (D)).

Example 6

A positive photoresist composition was prepared in the same manner as in Example 1, except that the amount of the ingredient (C) was changed to 5.7 parts by weight (3.0% by weight relative to the total weight of the ingredients (A), (B), and (D)).

Example 7

A positive photoresist composition was prepared in the same manner as in Example 1, except that an ester (b3) was used instead of b1 used in Example 1, which ester (b3) was an ester of 1 mole of 2,6-bis[2,5-dimethyl-3-(2-hydroxy-5-methylbenzyl)-4-hydroxybenzyl]-4-methylphenol and 2 moles of 5-NQD.

Example 8

A positive photoresist composition was prepared in the same manner as in Example 1, except that an ingredient b4 was employed instead of b1 used in the ingredient (B) of Example 1, which ingredient b4 was an ester (b4) of 1 mole of a phenol compound of the following formula (b4') and 2 moles of 5-NQD.

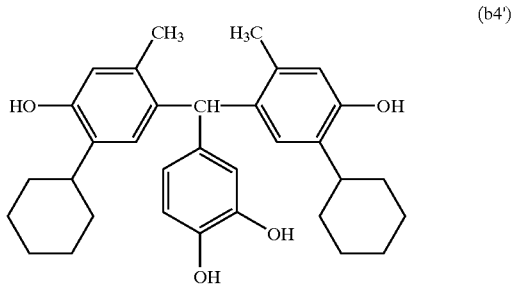

(b4')

Comparative Example 1

A positive photoresist composition was prepared in the same manner as in Example 1, except that the ingredient (C) was not added to the composition.

Comparative Example 2

A positive photoresist composition was prepared in the same manner as in Example 1, except that an ester (b5) of 1 mole of a phenol compound of the following formula (i) and 2 moles of 5-NQD was employed instead of b1 used in the ingredient (B) of Example 1.

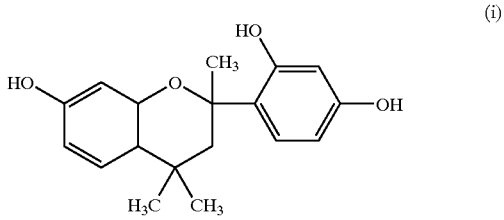

(i)

The characteristics (1) to (4) were determined on the positive photoresist compositions prepared in Examples 1 to 8 and Comparative Examples 1 and 2, and the results are shown in Table 1.

The relationships between the underexposure margin and the focal depth range on the compositions according to Example 1 and Comparative Examples 1 and 2 are illustrated in FIGS. 2 to 4 as process windows, respectively.

In FIGS. 2 to 4, the line indicates an exposure time period (ms) and the column indicates a focal depth range ($\mu$m). The diagonally shaded areas in the figures indicate areas where the resulting resist pattern had a variation within ±10% of the set dimensions (a 0.35-$\mu$m resist pattern with a L&S of 1:1). FIG. 2 shows that, diagonally shaded areas are wide in the positive photoresist composition of Example 1, indicating satisfactory focal depth range properties and underexposure margin. In contrast, in FIGS. 3 and 4 respectively corresponding to the positive photoresist compositions of Comparative Examples 1 and 2, the diagonally shaded areas are narrow, indicating inferior focal depth range properties and underexposure margin.

TABLE 1

| | Sensitivity (ms) | Underexposure Margin (Eop/Es) | Plus-side Focal Depth Range Properties ($\mu$m) | Total Focal Depth Range Properties ($\mu$m) | Definition ($\mu$m) |
|---|---|---|---|---|---|
| Ex. 1 | 490 | 1.38 | 0.8 | 1.4 | 0.28 |
| Ex. 2 | 520 | 1.41 | 0.8 | 1.4 | 0.26 |
| Ex. 3 | 550 | 1.35 | 0.8 | 1.4 | 0.28 |
| Ex. 4 | 565 | 1.45 | 0.6 | 1.2 | 0.28 |
| Ex. 5 | 460 | 1.35 | 0.7 | 1.3 | 0.30 |
| Ex. 6 | 550 | 1.48 | 0.6 | 1.2 | 0.26 |
| Ex. 7 | 550 | 1.35 | 0.8 | 1.4 | 0.30 |
| Ex. 8 | 385 | 1.32 | 0.7 | 1.3 | 0.30 |
| Comp. Ex. 1 | 475 | 1.28 | 0.6 | 1.0 | 0.30 |
| Comp. Ex. 2 | 415 | 1.28 | 0.5 | 0.8 | 0.32 |

Next, a series of photosensitive films having a thickness of 0.5 $\mu$m were prepared using the invented positive photoresist compositions, and the characteristics of the photosensitive films were evaluated.

Example 9

A positive photoresist composition was prepared in the following manner, was applied onto a silicon wafer using a spinner, and dried on a hot plate at 90° C. for 90 sec. to form a resist film having a thickness of 0.50 $\mu$m. The resist film was then irradiated through a mask (reticle) corresponding to a 0.30-$\mu$m resist pattern with a L&S of 1:1 using a reducing-type projection aligner NSR-2005i10D (manufactured by Nikon Corporation, Japan; NA=0.57). The film was then post-exposure baked (PEB) at 110° C. for 90 sec.; was subjected to developing in a 2.38% by weight tetramethylammonium hydroxide (TMAH) aqueous solution at 23° C. for 60 sec., was washed with water for 30 sec., and was dried. The sectional shape (profile) of the resulting 0.30-μm resist pattern with a L&S width of 1:1 was subjected to scanning electron micrographic (SEM) observation. The result is shown in FIG. 5.

Figure 5:
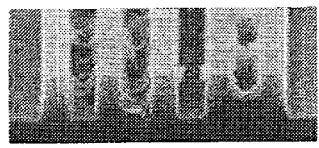
FIG. 5 is a sectional view of a resist pattern imaged using a composition according to Example 9.

FIG. 5 verifies that a resist pattern with a good shape was obtained, although some reduction in film thickness in unexposed areas and slight scum at the bottom of the pattern were observed.

Ingredient (A): a resin ingredient: an alkali-soluble novolak resin [the resin used in Example 1]

Ingredient (B): a photosensitizer: b1/b2=7/1 (by weight)

Ingredient (C): 2,2'4,4'-tetrahydroxybenzophenone

Ingredient (D): a sensitizer (intensifier): d1/d2=1/1 (by weight)

In 470 parts by weight of 2-heptanone, 100 parts by weight of the ingredient (A), 57 parts by weight of the ingredient (B), 15.2 parts by weight (8.0% by weight relative to the total weight of the ingredients (A), (B) and (D)) of the ingredient (C), and 33 parts by weight of the ingredient (D) were dissolved, and the resulting solution was filtrated through a 0.2-μm membrane filter to yield a positive photoresist composition.

Example 10

Figure 6:
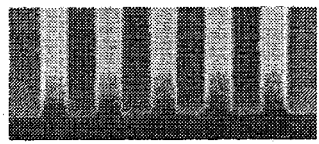
FIG. 6 is a sectional view of a resist pattern imaged using a composition according to Example 10.

A positive photoresist composition was prepared in the same manner as in Example 9, except that 100 parts by weight of the following novolak resin was employed as the ingredient (A). Using this positive photoresist composition, a resist pattern was imaged in the same manner as in Example 9. FIG. 6 shows a sectional view of the resulting resist pattern.

Ingredient (A): a resin ingredient: an alkali-soluble novolak resin [a novolak resin composed of hydroquinone:m-cresol:2,5-xylenol:p-cresol=5:55:30:10 (by mole) and having a weight average molecular weight of 6650, whose low molecular weight fractions were removed]

FIG. 6 shows that a resist pattern with a good shape was obtained, while little reduction in film thickness in unexposed areas and no scum were observed.

Comparative Example 3

A positive photoresist composition was prepared in the same manner as in Example 9, except that the ingredient (C) employed in Example 9 was not used. Using this positive photoresist composition, a resist pattern was to be imaged in the same manner as in Example 9. A sectional view of the resulting resist pattern is shown in FIG. 7.

Figure 7:
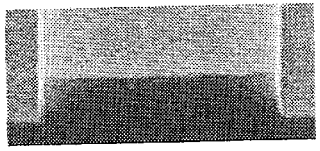
FIG. 7 is a sectional view of a resist pattern imaged using a composition according to Comparative Example 3.

FIG. 7 shows that exposed areas could not be removed, and an isolated resist pattern could not be obtained.

As thus described, the invention can provide a positive photoresist composition which exhibits a high sensitivity and a high definition and has improved focal depth range properties and underexposure margin, particularly in the production of very large scale integrated circuits (VLSIs) where a high definition of not more than 0.35 μm is required.

The invention can also provide a positive photoresist composition which can satisfactorily image an ultrafine resist pattern of not more than 0.30 μm in a process using a 0.2- to 0.8-μm thin film.

Other embodiments and variations will be obvious to those skilled in the art, and this invention is not to be limited to the specific matters stated above.

What is claimed is:

1. A positive photoresist composition comprising:

(A) an alkali soluble resin;

(B) a photosensitizer comprising a quinonediazide ester of at least one selected from compounds shown by the following formula (I):

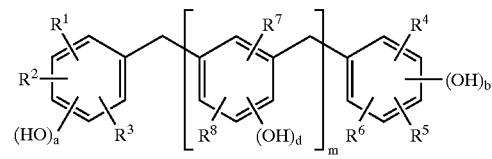

(I)

wherein each of $R^1$, $R^2$, $R^3$, $R^4$, $R^5$, $R^6$, $R^7$ and $R^8$ is independently a hydrogen atom, a halogen atom, an alkyl group having 1 to 6 carbon atoms, an alkoxy group having 1 to 6 carbon atoms, or a cycloalkyl group; each of a and b is an integer of 1 to 3; d is an integer of 0 to 3, and m is an integer of 1 to 3; and (C) a compound having a gram absorption coefficient of 5 to 60 with respect to light with a wavelength of 365 nm.

2. A positive photoresist composition according to claim 1, wherein said ingredient (A) is an alkali-soluble novolak resin obtained synthetically by a condensation reaction of a phenol compound ingredient with an aldehyde or a ketone, and said phenol compound ingredient comprises 1 to 20% by mole of a phenol compound shown by the following formula (III):

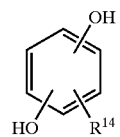

(III)

wherein $R^{14}$ is a hydrogen atom or an alkyl group having 1 to 5 carbon atoms, 30 to 95% by mole of m-cresol, and 2 to 50% by mole of 2,5-xylenol.

3. A positive photoresist composition according to claim 2, wherein said phenol compound ingredient for use in the synthesis of said ingredient (A) further comprises 1 to 30% by mole of at least one phenol compound selected from the group consisting of p-cresol, 3,4-xylenol, 3,5-xylenol, and dimethylol derivatives of these compounds.

4. A positive photoresist composition according to claim 2, wherein said phenol compound ingredient in said ingredient (A) comprises, instead of said 2,5-xylenol, 1 to 25% by mole of a phenol compound shown by the following formula (IV):

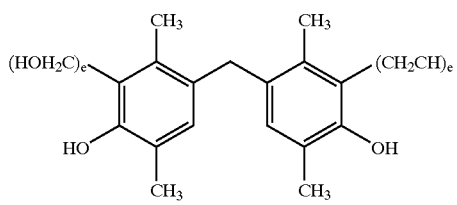

(IV)

wherein e is 0 or 1.

5. A positive photoresist composition according to claim 1, wherein said ingredient (C) is 2,2',4,4'-tetrahydroxybenzophenone having a gram absorption coefficient of 47.4.

6. A positive photoresist composition according to claim 1, wherein said ingredient (C) is a compound shown by the following formula (V) and having a gram absorption coefficient of 29.3

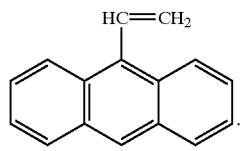

(V)

7. A positive photoresist composition according to claim 1, wherein said ingredient (C) is a compound shown by the following formula (VI) and having a gram absorption coefficient of 27.4

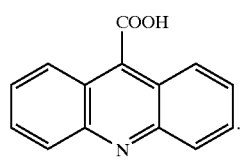

(VI)

8. A positive photoresist composition according to claim 1, wherein said ingredient (C) is a compound shown by the following formula (VII) and having a gram absorption coefficient of 18.8

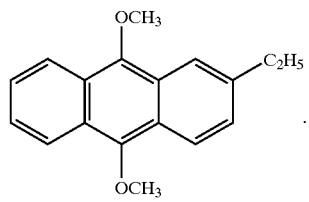

(VII)

9. A positive photoresist composition according to claim 1, wherein the combination ratio of said quinonediazide ester of at least one selected from compounds shown by formula (I-a) in Ingredient (B) is 50% by weight or more.

10. A substrate with a photosensitive film being obtained by applying a film of the positive photoresist composition as claimed in claim 1 onto a substrate, and drying the applied film to form a photosensitive film having a thickness of 0.2 to 0.8 μm on the substrate.

11. A process for imaging a resist pattern, said process comprising the steps of
    subjecting the substrate with a photosensitive film according to claim 10 to a selective exposure with i-ray (365 nm), and
    exposing the substrate to developer to image a resist pattern.

* * * * *